(12) United States Patent
Denda et al.

(10) Patent No.: US 9,192,049 B2
(45) Date of Patent: Nov. 17, 2015

(54) WIRING SUBSTRATE AND SEMICONDUCTOR PACKAGE

(71) Applicant: SHINKO ELECTRIC INDUSTRIES CO., LTD., Nagano (JP)

(72) Inventors: Tatsuaki Denda, Nagano (JP); Kazutaka Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/536,791

(22) Filed: Nov. 10, 2014

(65) Prior Publication Data

US 2015/0200337 A1  Jul. 16, 2015

(30) Foreign Application Priority Data

Jan. 14, 2014  (JP) .................................. 2014-004630
Apr. 28, 2014  (JP) .................................. 2014-092949

(51) Int. Cl.

| H01L 23/34 | (2006.01) |
| H01L 23/48 | (2006.01) |
| H01L 33/64 | (2010.01) |
| H05K 1/18 | (2006.01) |

(Continued)

(52) U.S. Cl.
CPC ............ *H05K 1/181* (2013.01); *H01L 23/3677* (2013.01); *H01L 23/49827* (2013.01); *H01L 24/04* (2013.01); *H01L 24/26* (2013.01); *H01L 24/47* (2013.01); *H01L 33/486* (2013.01); *H01L 33/60* (2013.01); *H05K 1/021* (2013.01); *H05K 1/115* (2013.01); *H01L 33/62* (2013.01); *H01L 33/64* (2013.01); *H01L 2224/48091* (2013.01); *H01L 2224/48137* (2013.01); *H01L 2224/73265* (2013.01); *H01L 2924/13055* (2013.01)

(58) Field of Classification Search
CPC ............ H01L 23/36; H01L 23/3675–23/3677; H01L 24/04–24/08; H01L 24/26–24/28; H01L 24/47–24/49; H01L 33/60; H01L 33/62; H01L 33/486

See application file for complete search history.

(56) References Cited

U.S. PATENT DOCUMENTS

| 5,923,084 A * | 7/1999 | Inoue ................... H01L 23/3121 257/712 |
| 6,611,055 B1 * | 8/2003 | Hashemi ............. H01L 23/3677 257/706 |

(Continued)

FOREIGN PATENT DOCUMENTS

| JP | 2007-287751 | 11/2007 |
| JP | 2011-249574 | 12/2011 |

(Continued)

*Primary Examiner* — Marvin Payen
*Assistant Examiner* — Jeremy Joy
(74) *Attorney, Agent, or Firm* — IPUSA, PLLC

(57) ABSTRACT

A wiring substrate for a semiconductor device includes a heat spreader; a polyimide layer provided with through holes and provided on the heat spreader via an adhesion layer; through wirings formed to fill the through holes of the polyimide layer; a thermal diffusion wiring provided on the polyimide layer and is configured not to be electrically connected to the semiconductor device; an electrical connection wiring provided on the polyimide layer at a same plane with the thermal diffusion wiring and is configured to be electrically connected to the semiconductor device; and an insulating layer provided on the polyimide layer with a first open portion and a second open portion that expose the electrical connection wiring and the thermal diffusion wiring, respectively, the thermal diffusion wiring being formed to extend at an outer side of the second open portion and have a larger area than the electrical connection wiring.

11 Claims, 13 Drawing Sheets

(51) Int. Cl.
*H05K 1/02* (2006.01)
*H05K 1/11* (2006.01)
*H01L 23/498* (2006.01)
*H01L 23/00* (2006.01)
*H01L 23/367* (2006.01)
*H01L 33/60* (2010.01)
*H01L 33/48* (2010.01)
*H01L 33/62* (2010.01)

(56) References Cited

U.S. PATENT DOCUMENTS

| | | | | |
|---|---|---|---|---|
| 7,550,319 | B2 * | 6/2009 | Wang | C03C 8/02 257/432 |
| 2001/0003372 | A1 * | 6/2001 | Huang | H01L 23/4334 257/666 |
| 2002/0066948 | A1 * | 6/2002 | Kim | H01L 23/3128 257/678 |
| 2007/0252270 | A1 * | 11/2007 | Takano | H01L 23/3677 257/723 |
| 2013/0092421 | A1 * | 4/2013 | Kajiya | H05K 1/0206 174/252 |
| 2013/0126916 | A1 * | 5/2013 | Arai | H01L 27/15 257/88 |
| 2013/0192880 | A1 | 8/2013 | Nakanishi et al. | |
| 2014/0268780 | A1 * | 9/2014 | Wang | F21V 19/003 362/249.06 |

FOREIGN PATENT DOCUMENTS

| | | |
|---|---|---|
| JP | 2013-157441 | 8/2013 |
| JP | 2013-229490 | 11/2013 |

* cited by examiner

WIRING SUBSTRATE AND SEMICONDUCTOR PACKAGE

CROSS-REFERENCE TO RELATED APPLICATION

The present application is based on and claims the benefit of priority of Japanese Priority Application No. 2014-004630 filed on Jan. 14, 2014 and Japanese Priority Application No. 2014-092949 filed on Apr. 28, 2014, and the entire contents of which are hereby incorporated by reference.

BACKGROUND OF THE INVENTION

1. Field of the Invention

The present invention relates to a wiring substrate and a semiconductor package.

2. Description of the Related Art

Recently, a wiring substrate has been provided for mounting a semiconductor device such as a light emitting device or the like. For example, a wiring substrate is known in which a wiring is formed on a heat spreader via an adhesion layer. In such a wiring substrate, when heat is generated by a semiconductor device that is mounted on the wiring, it is necessary to transfer the heat to the heat spreader. At this time, as the adhesion layer functions as a part of a radiation path, a material with a high coefficient of thermal conductivity such as insulating resin including alumina filler or the like is used as the adhesion layer.

However, as the wiring and the heat spreader are electrically-conductive materials, if the adhesion layer is made thin (about 50 µm, for example), there is a possibility that the wiring and the heat spreader are not sufficiently insulated. Thus, it is necessary to form the adhesion layer to have a thickness of about 100 to 200 µm. On the other hand, although the wiring and the heat spreader are sufficiently insulated by forming the adhesion layer to have the thickness of about 100 to 200 µm, in such a case, there is another problem that a thermal radiation property becomes lower due to the increase of heat resistance of the adhesion layer.

As described above, it is difficult for a conventional wiring substrate for mounting a heat generation semiconductor device such as a light emitting device or the like to ensure an insulation property and to improve a thermal radiation property at the same time.

Patent Document

[Patent Document 1] Japanese Laid-open Patent Publication No. 2011-249574

SUMMARY OF THE INVENTION

The present invention is made in light of the above problems, and provides a wiring substrate or the like capable of ensuring an insulation property and improving a thermal radiation property at the same time.

According to an embodiment, there is provided a wiring substrate on which a semiconductor device is mounted, the wiring substrate including a heat spreader; a polyimide layer provided on the heat spreader via an adhesion layer that includes filler, the polyimide layer being provided with a plurality of through holes penetrating the polyimide layer in the thickness direction; a plurality of through wirings formed to fill the through holes provided at the polyimide layer, respectively; a thermal diffusion wiring provided on the polyimide layer so as to be connected to the through wirings, the thermal diffusion wiring being configured not to be electrically connected to the semiconductor device; an electrical connection wiring provided on the polyimide layer at a same plane with the thermal diffusion wiring, the electrical connection wiring being configured to be electrically connected to the semiconductor device; and an insulating layer provided on the polyimide layer and provided with a first open portion that exposes the electrical connection wiring and a second open portion that exposes the thermal diffusion wiring, the thermal diffusion wiring being formed to extend at an outer side of the second open portion and have a larger area than the electrical connection wiring, in a plan view.

Note that also arbitrary combinations of the above-described elements, and any changes of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1A:
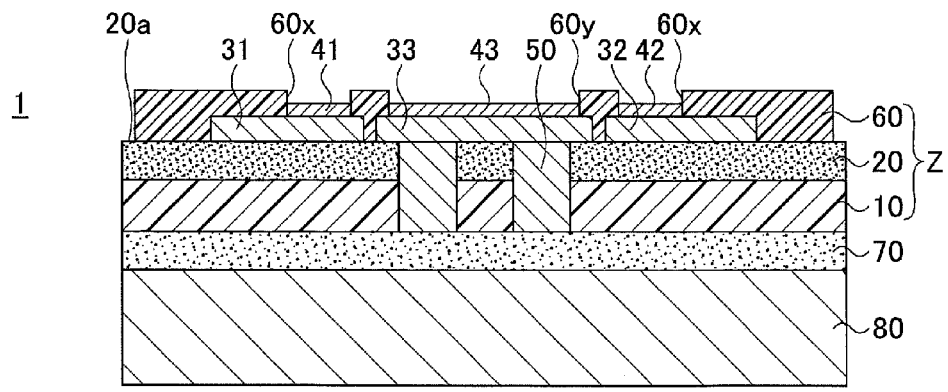
FIG. 1A and FIG. 1B are views illustrating an example of a wiring substrate of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

Structure of Wiring Substrate of First Embodiment

Figure 1B:
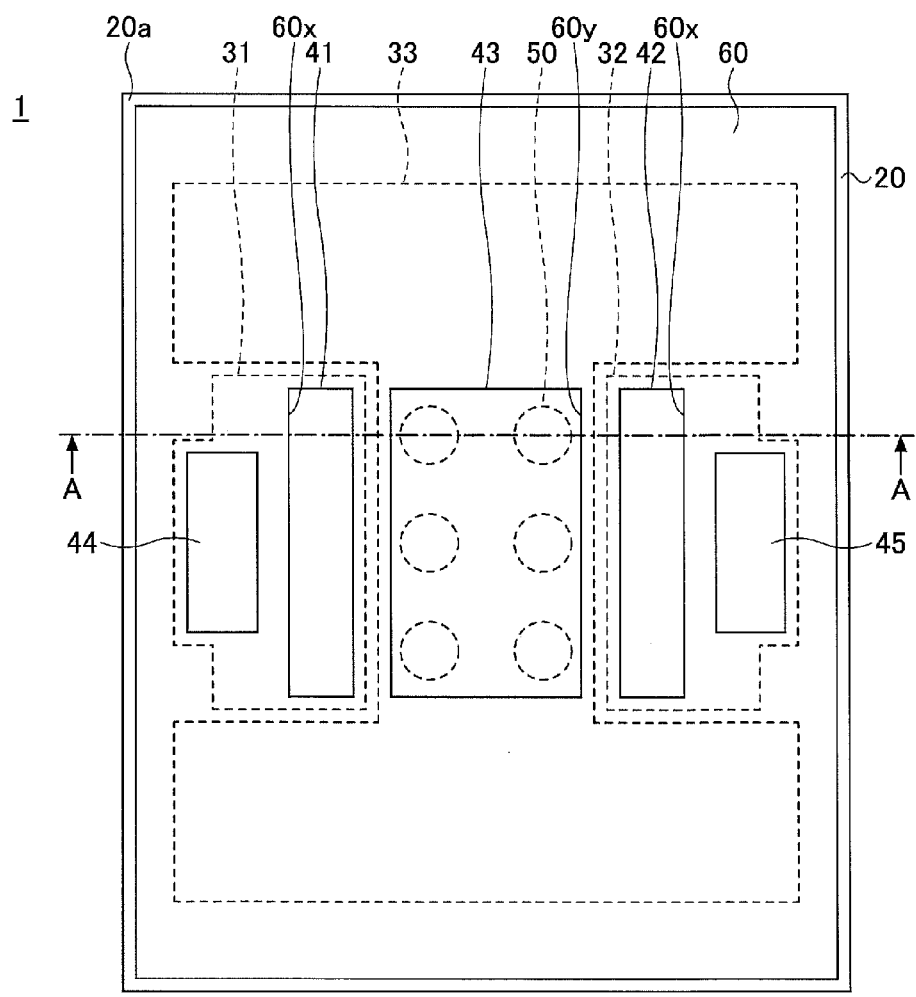

First, a structure of a wiring substrate of a first embodiment is explained. FIG. 1A and FIG. 1B are views illustrating a wiring substrate 1 of the first embodiment. FIG. 1B is a plan view and FIG. 1A is a cross-sectional view taken along an A-A line of FIG. 1B.

With reference to FIG. 1A and FIG. 1B, the wiring substrate 1 basically includes a polyimide layer 10, an adhesion layer 20, wirings 31 to 33, plating films 41 to 45, through wirings 50, an insulating layer 60, an adhesion layer 70 and a heat spreader (heat sink) 80. A portion of the wiring substrate 1 including the polyimide layer 10, the adhesion layer 20, the wirings 31 to 33, the plating films 41 to 45 and the through wirings 50 is referred to as a "wiring portion Z" as well. This means that the wiring substrate 1 has a structure in which the wiring portion Z is placed on the heat spreader 80 via the adhesion layer 70. Here, the adhesion layer 20 is an optional element and the wiring substrate 1 may not include the adhesion layer 20.

In this embodiment, an insulating layer 60 side of the wiring substrate 1 is referred to as an upper side or one side, and a heat spreader 80 side of the wiring substrate 1 is referred to as a lower side or the other side. Further, a surface of each component at the insulating layer 60 side is referred to as an upper surface or one surface, and a surface at the heat spreader 80 side is referred to as a lower surface or the other surface. However, the wiring substrate 1 may be used in an opposite direction or may be used at an arbitrarily angle. Further, in this embodiment, "in a plan view" means that an object is seen in a direction that is normal to one surface of the polyimide layer 10, and a "plan shape" means a shape of an object seen in the direction that is normal to the one surface of the polyimide layer 10.

In the wiring substrate 1, the polyimide layer 10 may be made of a flexible polyimide-based insulating resin film, for example. The thickness of the polyimide layer 10 may be about 25 to 75 µm, for example.

The adhesion layer 20 is adhered to the one surface of the polyimide layer 10 and adheres the wirings 31 to 33 to the polyimide layer 10. For the adhesion layer 20, a heat-resistant adhesive agent made of insulating resin such as an epoxy-based adhesive agent, a polyimide-based adhesive agent or the like may be used, for example. The thickness of the adhesion layer 20 may be about 5 to 15 µm, for example.

The wirings 31 to 33 are provided on the one surface of the polyimide layer 10 via the adhesion layer 20, and are electrically insulated from each other. Although not illustrated in FIG. 1A and FIG. 1B, as will be explained later, a semiconductor device such as a light emitting device, a module including the semiconductor device, or the like is to be mounted on the wiring substrate 1. The wirings 31 and 32 are electrical connection wirings that are electrically connected to terminals of the semiconductor device or the like. The wiring 33 is a thermal diffusion wiring that does not affect an operation of the semiconductor device or the like. In other words, the wiring 33 is not electrically connected to the semiconductor device or the like. Yet in other words, current does not flow through the wiring 33. The electrical connection wirings and the thermal diffusion wiring are formed at a same plane on the polyimide layer 10. Specifically, in this embodiment, the electrical connection wirings and the thermal diffusion wiring are formed at an upper surface of the adhesion layer 20. The wiring 33 is connected to an end of each of the through wirings 50 that penetrate the polyimide layer 10 and the adhesion layer 20. An embodiment in which the semiconductor device is mounted on the wirings 31 to 33 is explained later.

As illustrated in FIG. 1B, the insulating layer 60 is provided with an open portion 60y from which the plating film 43 is exposed. As will be explained later, the semiconductor device or the like or a thermal radiation terminal of the semiconductor device or the like is mounted on the plating film 43 exposed from the open portion 60y. The wiring 33 (thermal diffusion wiring) extends outside of the open portion 60y and is formed to have a larger size than the open portion 60y (in other words, the thermal radiation terminal of the semiconductor device or the like, for example) in a plan view. In other words, the wiring 33 is formed to have a larger size than the wiring 31 or 32 at the upper surface of the polyimide layer 10 (or the adhesion layer 20) in a plan view.

For example, in FIG. 1B, the wiring 33 is formed to have an H-shape and to cover the upper surface of the adhesion layer 20 except the areas where the wirings 31 and 32 are formed. Here, the wiring 31 and the wiring 32 are formed at concave portions of the H-shaped wiring 33 such as to face with each other. As such, by extending the wiring 33 to have a larger size, the heat generated at the semiconductor device or the like can be diffused via the wiring 33 in a surface direction of the wiring 33, in addition to via the through wirings 50. Thus, thermal radiation efficiency can be improved.

The plan shape of the wiring 33 is not limited to the H-shape, and the wiring 33 may have various shapes such as a rectangular shape, a polygonal shape, a circular shape, a combined shape of them, or the like in accordance with the shapes or positions of the wirings 31 and 32. In such a case, the wiring 33 may be provided such that a part of the wiring 33 exists between the wiring 31 and the wiring 32 that face with each other (see FIG. 7B, for example).

For the material of the wirings 31 to 33, copper (Cu) or the like may be used, for example. The thickness of the wirings 31 to 33 may be about 12 to 35 µm, for example.

The plating films 41 to 43 are formed at portions of the wirings 31 to 33 that are exposed from the upper surface of the insulating layer 60. Although not illustrated in FIG. 1A, the wiring 31 includes an area that is one of external connection terminals and the plating film 44 is formed on that area. This means that the plating film 41 and the plating film 44 are electrically connected with each other. Similarly, the wiring 32 includes an area that is another of the external connection terminals and the plating film 45 is provided on that area. This means that the plating film 42 and the plating film 45 are electrically connected with each other. Each of the plating films 41 to 45 may be formed to have long narrow strip shape, for example, and the plating films 41 to 45 may be aligned to have a predetermined space therebetween.

For the material of the plating films 41 to 45, a plating film in which Ni (or a Ni alloy film) and Au (or an Au alloy film) are stacked in this order may be used, for example. Alternatively, for the material of the plating films 41 to 45, a plating film in which Ni (or a Ni alloy film), Pd (or a Pd alloy film) and Au (or an Au alloy film are stacked in this order; a plating film in which Ni (or a Ni alloy film), Pd (or a Pd alloy film), Ag (or an Ag alloy film) and Au (or an Au alloy film) are stacked in this order; a plating film of Ag (or an Ag alloy film); a plating film in which Ni (or a Ni alloy film) and Ag (or an Ag alloy film) are stacked in this order; a plating film in which Ni (or a Ni alloy film), Pd (or a Pd alloy film) and Ag (or an Ag alloy film) are stacked in this order; or the like may be used.

Among the plating films 41 to 45, it is preferable that the thickness of each of Au (or the Au alloy film) and Ag (or the Ag alloy film) is more than or equal to 0.1 µm. Further, among the plating films 41 to 45, it is preferable that the thickness of Pd (or the Pd alloy film) is more than or equal to 0.005 µm. Further, among the plating films 41 to 45, it is preferable that the thickness of Ni (or the Ni alloy film) is more than or equal to 0.5 µm.

The through wirings 50 are wirings for thermal radiation and are referred to as thermal vias as well. This means that the through wirings 50 function as a part of a path that releases heat generated by the semiconductor device or the like mounted on the wiring substrate 1 when the semiconductor device or the like is operated, to the heat spreader 80 side.

The polyimide layer 10 and the adhesion layer 20 are provided with a plurality of through holes that penetrate the polyimide layer 10 and the adhesion layer 20 in the thickness direction. The plurality of through wirings 50 are provided to fill the through holes formed in the polyimide layer 10 and the adhesion layer 20. The through wirings 50 are provided on the other surface of the wiring 33 (thermal diffusion wiring) at the polyimide layer 10 side. Thus, in this embodiment, the plurality of through wirings 50 (six through wirings, for example, in the example illustrated in FIG. 1B) are provided right below the wiring 33. With this configuration, the thermal radiation property can be improved.

The through wirings 50 are integrally formed with the wiring 33. One end of each of the through wirings 50 is connected to the wiring 33 and the other end of each of the through wirings 50 is exposed from the other surface of the polyimide layer 10. Alternatively, the through wirings 50 may be configured such that the other end of each of the through wirings 50 protrudes from the other surface of the polyimide layer 10. The plan shape of each of the through wirings 50 may be a circular shape with a diameter of about 0.5 to 1 mm, for example. However, the diameter of each of the through wirings 50 may be more than or equal to 1 mm when it is desired to specifically improve the thermal radiation property or the like. The plan shape of each of the through wirings 50 may be an ellipse shape, a rectangular shape or the like, for example. The thickness of the through wirings 50 may be about 25 to 75 µm, for example. For the material of the through wirings 50, copper (Cu) or the like may be used, for example.

Here, the through wirings 50 are not provided right below the wirings 31 and 32. This means that the wirings 31 and 32 (electrical connection wirings) are only formed to extend on a plane surface (the upper surface of the adhesion layer 20). In other words, only the adhesion layer 20, the polyimide layer 10 and the adhesion layer 70 exist between the wirings 31 and 32 and the heat spreader 80, and any other wirings or the like for electrical connection do not exist in the adhesion layer 20, the polyimide layer 10 and the adhesion layer 70 at areas overlapping with the wirings 31 and 32, respectively, in a plan view. With this configuration, the insulating properties between the wirings 31 and 32 and the heat spreader 80 can be improved.

When the semiconductor device is a light emitting device, the insulating layer 60 may be a reflection film that is provided on the polyimide layer 10 in order to improve reflectivity of light emitted by the light emitting device and to improve thermal diffusivity. The insulating layer 60 is provided with open portions 60x that selectively expose the wirings 31 and 32 (electrical connection wirings) and the open portion 60y as described above that selectively exposes the wiring 33 (thermal diffusion wiring). As described above, the plating films 41 to 45 are provided on the wirings 31 to 33 that are exposed from the insulating layer 60. For the material of the insulating layer 60, epoxy-based resin, silicone-based resin such as organo-polysiloxane or the like, including filler such as titanium oxide ($TiO_2$), barium sulfate ($BaSO_4$) or the like or dye may be used, for example. Alternatively, for the material of the insulating layer 60, white ink made of such a material may be used.

It is preferable that the insulating layer 60 is formed to expose an outer edge portion 20a of the adhesion layer 20. With this configuration, as it is unnecessary to cut the insulating layer 60 when dicing (cutting) and dividing each of the areas, each of which finally becomes the wiring substrate 1, in manufacturing the wiring substrate 1, chipping or removal of an edge of the insulating layer 60 can be prevented. With this, decreasing of a surface area of the insulating layer 60 can be prevented and lowering of reflectivity of the insulating layer can be prevented.

The adhesion layer 70 is provided on the heat spreader 80 and contacts the other surface of the polyimide layer 10 to adhere the polyimide layer 10 and the heat spreader 80. As the adhesion layer 70 becomes a part of the path that releases the heat transferred from the through wirings 50 to the heat spreader 80, it is preferable that a material whose coefficient of thermal conductivity is high is used for the adhesion layer 70. For the adhesion layer 70, a heat-resistant adhesive agent made of insulating resin such as an epoxy-based adhesive agent, a polyimide-based adhesive agent or the like including filler such as alumina or the like may be used, for example. Here, the filler included in the adhesion layer 70 may be electrically-conductive filler. The thickness of the adhesion layer 70 may be about 20 to 50 µm, for example.

The heat spreader 80 is adhered to the other surface of the polyimide layer 10 by the adhesion layer 70. For the material of the heat spreader 80, a metal plate made of a material whose coefficient of thermal conductivity is high such as copper (Cu), aluminium (Al) or the like may be used, for example. Alternatively, an insulating plate made of an insulating material whose coefficient of thermal conductivity is high such as ceramics like alumina, aluminum nitride or the like, silicon or the like may be used as the heat spreader 80. The thickness of the heat spreader 80 may be about 100 to 1000 µm, for example. However, the thickness of the heat spreader 80 may be about a few mm when a particularly high thermal radiation property is required.

An advantage of a structure of the embodiment in which the through wirings 50 are not provided right below the wirings 31 and 32 and the through wirings 50 are only provided right below the wiring 33 is explained. If the through wirings 50 are provided right below the wirings 31 and 32, the other end of each of the through wirings 50 that exposes from the other surface of the polyimide layer 10 faces the heat spreader 80 via the adhesion layer 70 including filler such as alumina or the like. As the wirings 31 and 32 are the electrical connection wirings, in particular, when the thickness of the adhesion layer 70 is thin (about 20 to 50 µm, for example), leakage may occur from the through wirings 50 to the heat spreader 80 via the adhesion layer 70 to lower the insulating property.

Thus in order to provide the through wirings 50 right below the wirings 31 and 32, it is necessary to make the adhesion layer 70 thick to a certain extent (about 100 to 150 µm, for example) to ensure the insulating property. However, the adhesion layer 70 functions as a part of a thermal radiation path between the through wirings 50 and the heat spreader 80. Thus, if the adhesion layer 70 is made thick in order to ensure the insulating property, heat resistance increases and the thermal radiation property is lowered. Thus, it is difficult to ensure the insulating property and the thermal radiation property at the same time when the through wirings 50 are provided right below the wirings 31 and 32.

On the other hand, according to the present embodiment, as the through wirings 50 are not provided right below the wirings 31 and 32, there is no risk of lowering of the insulating property even when the adhesion layer 70 is made thin (about 50 μm, for example) to lower heat resistance. Further, although the through wirings 50 are provided right below the wiring 33, the wiring 33 is the thermal diffusion wiring and is not electrically connected to the semiconductor device or the like that is mounted on the wiring substrate 1 and current does not flow through the wiring 33. Thus, even when the other end of each of the through wirings 50 faces the heat spreader 80 via the relatively thin adhesion layer 70 (about 20 to 50 μm, for example), leakage does not occur.

For example, dielectric breakdown voltage (kV) and heat resistance (° C./W) become as illustrated in Table 1 when the thickness of the adhesion layer 70 whose coefficient of thermal conductivity is 3 W/m·K is varied. Conditions A and B are relative examples in which the through wirings 50 are not provided at all. Further, conditions C and D are examples of the embodiment in which the through wirings 50 are not provided right below the wirings 31 and 32 but the through wirings 50 are provided only right below the wiring 33 (see FIG. 1A and FIG. 1B). Here, values of heat resistance express heat resistance of a portion at which the plating film 43 is formed, in a thickness direction in FIG. 1A.

TABLE 1

| CONDITION | THICKNESS OF ADHESION LAYER 70 (μm) | THICKNESS OF THROUGH WIRING 50 (μm) | DIELECTRIC BREAKDOWN VOLTAGE (kV) | HEAT RESISTANCE (° C./W) |
| --- | --- | --- | --- | --- |
| A | 100 | — | 4.6 | 0.41 |
| B | 150 | — | 5.8 | 0.58 |
| C | 20 | 50 | 6.1 | 0.15 |
| D | 50 | 50 | 6.9 | 0.25 |

With reference to Table 1, for the condition A (the thickness of the adhesion layer 70 is 100 μm), dielectric breakdown voltage is 4.6 kV and heat resistance is 0.4° C./W. Further, for the condition B (the thickness of the adhesion layer 70 is 150 μm), dielectric breakdown voltage is 5.8 kV and heat resistance is 0.58° C./W. As such, when the thickness of the adhesion layer 70 becomes thicker, dielectric breakdown voltage is improved but heat resistance also increases.

On the other hand, for the condition C (the thickness of the adhesion layer 70 is 20 μm and the thickness of the through wirings 50 is 50 μm), dielectric breakdown voltage is 6.1 kV and heat resistance is 0.15° C./W. Further, for the condition D (the thickness of the adhesion layer 70 is 50 μm and the thickness of the through wirings 50 is 50 μm), dielectric breakdown voltage is 6.9 kV and heat resistance is 0.25° C./W. For the conditions C and D, compared with the conditions A and B, heat resistance is largely improved. In particular, by comparing the conditions B and D, it can be understood that according to the embodiment, heat resistance can be reduced to less than half while ensuring the same amount of the dielectric breakdown voltage.

As such, with a structure in which the through wirings 50 are not provided right below the wirings 31 and 32 but the through wirings 50 are provided only right below the wiring 33, which is the thermal diffusion wiring and current does not flow therethrough, the insulating property can be ensured and the thermal radiation property can also be improved at the same time even when the relatively thin adhesion layer 70 is used.

(Method of Manufacturing Wiring Substrate of First Embodiment)

Next, a method of manufacturing the wiring substrate 1 of the first embodiment is explained. FIG. 2A to FIG. 6D are views illustrating an example of a method of manufacturing the wiring substrate 1 of the first embodiment. The cross-sectional views used for explaining the method of manufacturing the wiring substrate 1 of the first embodiment correspond to FIG. 1A.

Figure 2A:
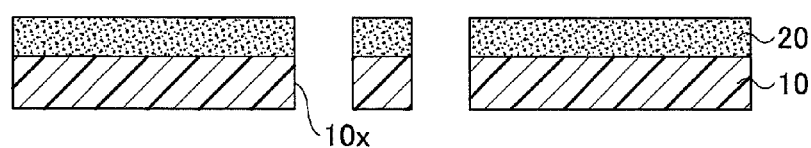
FIG. 2A to FIG. 2C are views illustrating an example of a manufacturing step of the wiring substrate of the first embodiment.

First, in a step illustrated in FIG. 2A, a polyimide film in a reel form (or tape form) is prepared as the polyimide layer 10, for example. Then, the adhesion layer 20 is formed on the one surface of the polyimide layer 10 by coating an epoxy-based adhesive agent or the like. Alternatively, instead of coating the epoxy-based adhesive agent or the like, the adhesion layer 20 may be formed by adhering an epoxy-based adhesive film on the one surface of the polyimide layer 10. Then, the polyimide layer 10 and the adhesion layer 20 are provided with through holes 10x that penetrate the polyimide layer 10 and the adhesion layer 20. The through holes 10x may be formed by punching, for example. Here, although the polyimide layer 10 or the like has a plurality of areas of which each becomes the wiring substrate 1, only one of the areas that becomes the wiring substrate 1 is explained in the following.

Figure 2B:
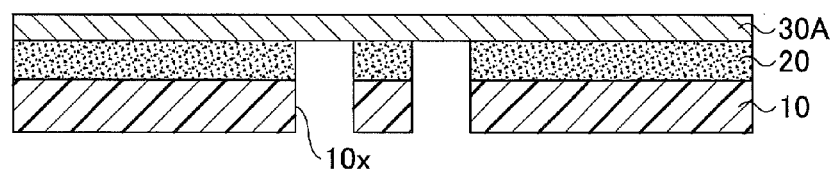

Next, in a step illustrated in FIG. 2B, a metal layer 30A is formed on the adhesion layer 20. The metal layer 30A finally becomes the wirings 31 to 33 after being patterned. Then, the adhesion layer 20 is cured by heating to a predetermined temperature. The metal layer 30A may be formed by laminating a copper film on the adhesion layer 20, for example. The thickness of the metal layer 30A may be about 18 to 35 μm, for example. Thereafter, an upper surface of the metal layer 30A and a lower surface of the metal layer 30A exposed in each of the through holes 10x are etched (so-called soft etching) by immersing the structure illustrated in FIG. 2B in wet etching solution (hydrogen peroxide-based solution, for example). By this etching process, rust-inhibitor that exists at the surfaces of the metal layer 30A is removed and the surfaces of the metal layer 30A are also slightly (about 0.5 to 1 μm, for example) removed. This etching process is not essentially performed and may be performed in accordance with necessity.

Figure 2C:
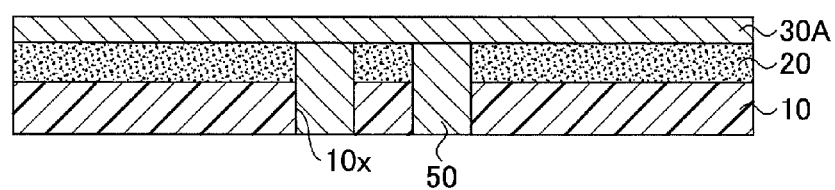

Next, in a step illustrated in FIG. 2C, the through wirings 50 that are integrally connected to the metal layer 30A are formed in the through holes 10x, respectively. Specifically, first, a masking tape is adhered to the upper surface of the metal layer 30A. The masking tape is provided to cover the upper surface of the metal layer 30A in order to prevent generation of a plating film at the upper surface of the metal layer 30A when forming the through wirings 50 by electroplating.

After adhering the masking tape, the through wirings 50 are formed by electroplating using the metal layer 30A as a power supply layer. Then, the masking tape is removed. The through wirings 50 are formed by depositing plating metal at the lower surface of the metal layer 30A that is exposed in each of the through holes 10x and filling the plating metal in each of the through holes 10x. Each of the through wirings 50 is formed to have a columnar shape. Each of the through wirings 50 is formed such that one end (an upper end in FIG. 2C) is connected to the metal layer 30A and the other end (a lower end in FIG. 2C) is exposed from the other surface of the polyimide layer 10.

The other end of the through wiring 50 may be flush with the other surface of the polyimide layer 10, or may be protruded from the other surface of the polyimide layer 10. When the other end of the through wiring 50 is flush with the other surface of the polyimide layer 10, the thickness of the wiring portion Z can be made thinner and evenness of the wiring portion Z when being bonded to the heat spreader 80 can be ensured. When the other end of the through wiring 50 is protruded from the other surface of the polyimide layer 10, surface area can be increased due to the protrusion and thermal radiation property can be improved. For the material of the through wirings 50, copper (Cu) or the like may be used, for example.

Figure 3A:
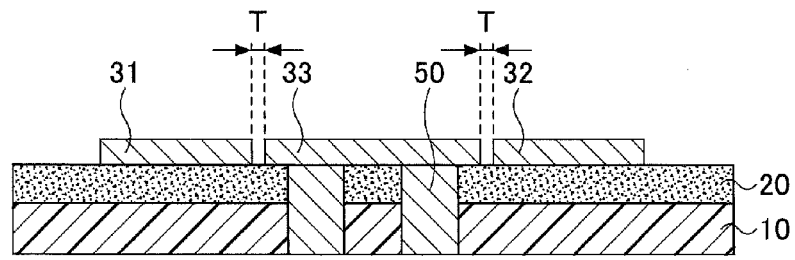
FIG. 3A and FIG. 3B are views illustrating an example of a manufacturing step of the wiring substrate of the first embodiment.
Figure 3B:
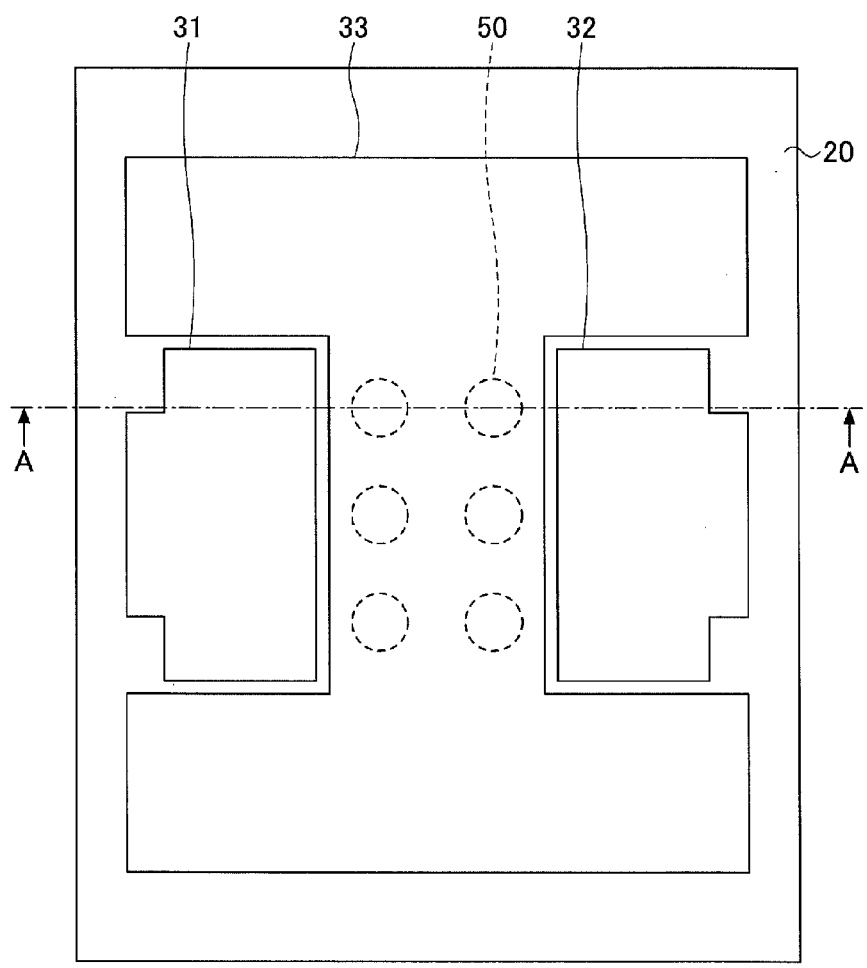

Next, in a step illustrated in FIG. 3A and FIG. 3B (FIG. 3B is a plan view and FIG. 3A is a cross-sectional view taken along an A-A line in FIG. 3B), the metal layer 30A is patterned to be formed into the wirings 31 to 33. Further, although not illustrated in the drawings, a bus line connected to the wirings 31 to 33 is also formed with the wirings 31 to 33. The bus line is used for forming the plating films 41 to 45 by electroplating in the following process. Specifically, the wirings 31 to 33 are formed by coating resist (not illustrated in the drawings) on the metal layer 30A and exposing and developing the resist to have a pattern corresponding to the wirings 31 to 33 and the bus line, for example. Then, the metal layer 30A is etched (patterned) using the resist to be the wirings 31 to 33 and the bus line. Thereafter, the resist is removed.

At this time, if a space T between the wiring 33 and the wiring 31 or 32 is narrow, when voltage is applied to the wiring 31 or 32, opposite voltage is induced on the wiring 33, that is in the vicinity of the wiring 31 or 32. In such a case, there is a possibility that insulation reliability between the wiring 33 and the heat spreader 80 is reduced. Thus, it is preferable that the space T between the wiring 33 and the wiring 31 or 32 is sufficiently wide so that voltage is not induced on the wiring 33.

Figure 4A:
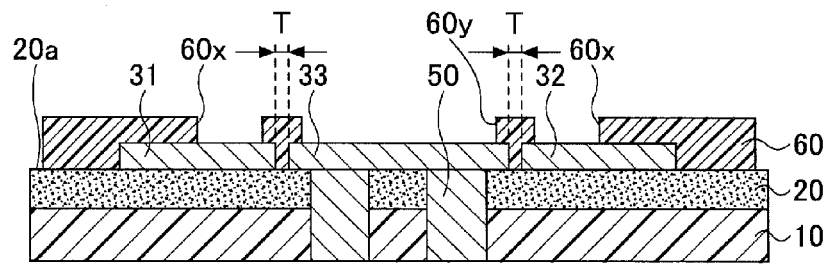
FIG. 4A and FIG. 4B are views illustrating an example of a manufacturing step of the wiring substrate of the first embodiment.
Figure 4B:
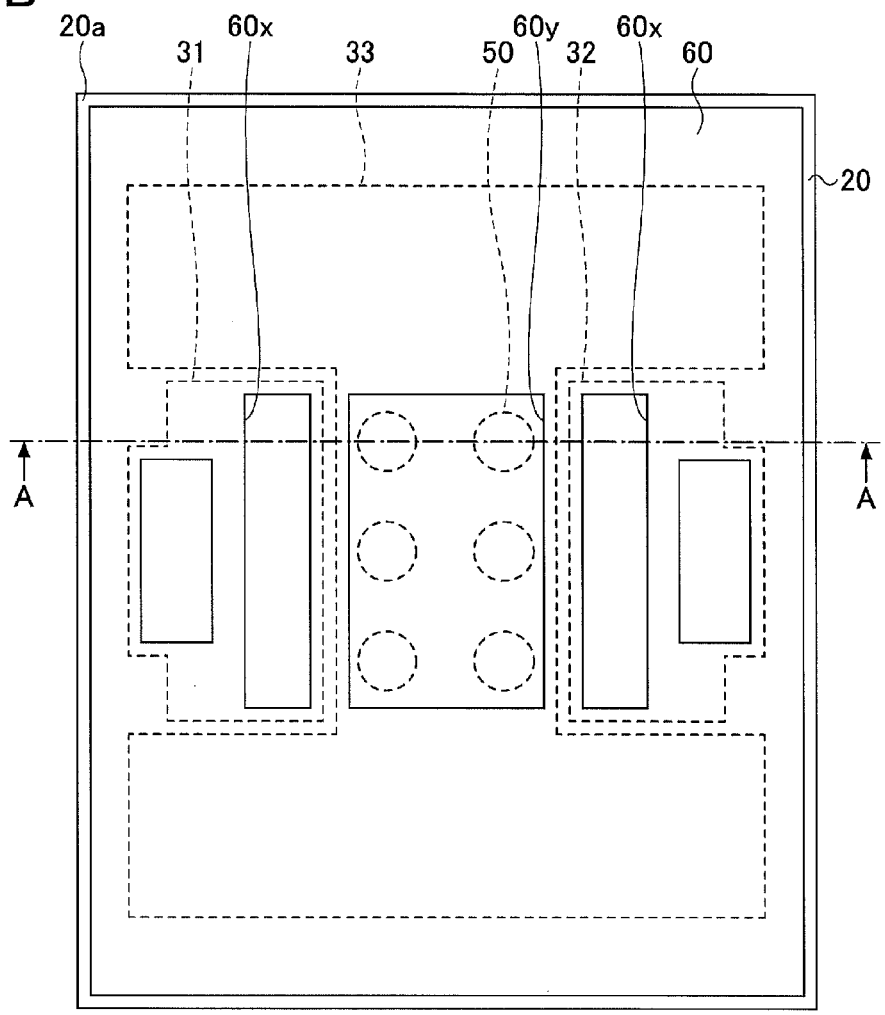

Next, in a step illustrated in FIG. 4A and FIG. 4B (FIG. 4B is a plan view and FIG. 4A is a cross-sectional view taken along an A-A line in FIG. 4B), the insulating layer 60 (reflection film) that selectively exposes the wirings 31 to 33 is formed. In other words, the insulating layer 60 is formed to expose portions where the plating films 41 to 45 are formed. Specifically, the insulating layer 60 is formed to be provided with the open portions 60x that selectively expose the wirings 31 and 32 (electrical connection wiring) and the open portion 60y that selectively exposes the wiring 33 (thermal diffusion wiring).

Further, the insulating layer 60 is formed to fill the space T between the wiring 31 and the wiring 33, and the space T between the wiring 32 and the wiring 33. By forming the insulating layer 60 between the wirings 31 and 32 (electrical connection wiring) and the wiring 33 (thermal diffusion wiring), the insulating property and reflection efficiency can be improved.

For the material of the insulating layer 60, a white-based material may be used, as described above. The insulating layer 60 may be formed by screen printing or the like, for example. Alternatively, the insulating layer 60 may be formed by forming white ink or the like to cover the entirety of the wirings 31 to 33, and then exposing portions where the plating films 41 to 45 are formed by photolithography, blasting, laser processing or the like.

Here, it is preferable that the insulating layer 60 is formed to expose the outer edge portion 20a of the adhesion layer 20 in each of the areas that becomes the wiring substrate 1. With this configuration, as it is unnecessary to cut the insulating layer 60 when dicing (cutting) and dividing each of the areas, each of which finally becomes the wiring substrate 1, chipping or removal of an edge of the insulating layer 60 can be prevented. With this, decreasing of a surface area of the insulating layer 60 can be prevented and lowering of reflectivity of the insulating layer can be prevented. Alternatively, the insulating layer 60 may be provided not to expose the outer edge portion 20a in accordance with necessity (see FIG. 6D).

Figure 5A:
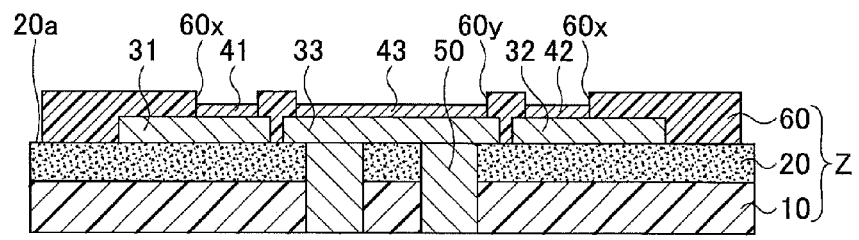
FIG. 5A and FIG. 5B are views illustrating an example of a manufacturing step of the wiring substrate of the first embodiment.
Figure 5B:
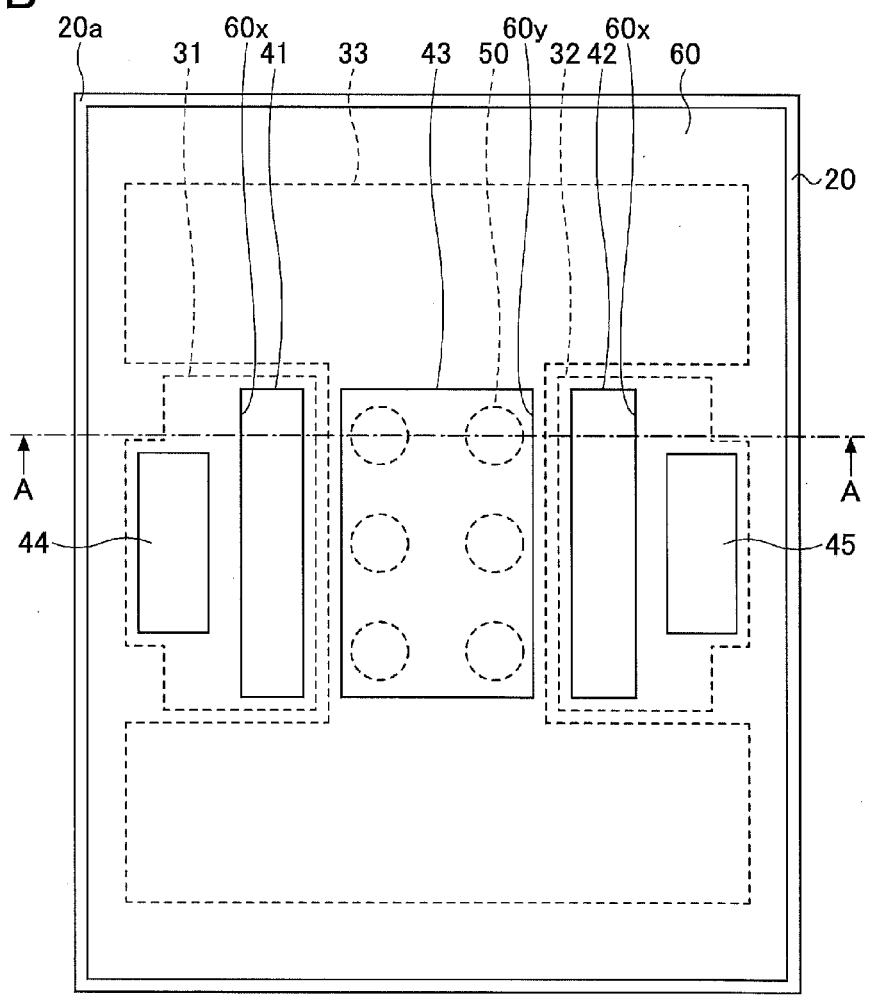

Next, in a step illustrated in FIG. 5A and FIG. 5B (FIG. 5B is a plan view and FIG. 5A is a cross-sectional view taken along an A-A line in FIG. 5B), the plating films 41 to 45 are formed on the wirings 31 to 33 by electroplating. Specifically, for example, a masking tape is adhered to the other surface of the polyimide layer 10. Then, electroplating is performed using an electric power supply path including the bus line connected to the wirings 31 to 33 to form the plating films 41 to 45 at the upper surfaces of the wirings 31 to 33 that are exposed from the insulating layer 60. Thereafter, the masking tape is removed. The material, the thickness and the like of each of the plating films 41 to 45 are as described above.

Next, an outer edge portion (parts of the polyimide layer 10, the adhesion layer 20 or the like that are exposed from the insulating layer 60) of the structure illustrated in FIG. 5A and FIG. 5B is cut and divided by press working, numerical control machining, laser processing or the like to form a plurality of the wiring portions Z of the wiring substrates 1. At this time, the bus line connected to the wirings 31 to 33 is cut at the same time.

Next, the divided wiring portion Z is bonded on the heat spreader 80 via the adhesion layer 70. Specifically, the adhesion layer 70 is formed by adhering a thermosetting epoxy-based adhesive film or the like including filler such as alumina or the like on the heat spreader 80, for example. Then, the divided wiring portion Z is placed on the adhesion layer 70. Then, the divided wiring portion Z is pressed toward a heat spreader 80 side while heating at predetermined temperature to cure the adhesion layer 70. Alternatively, the adhesion layer 70 may be formed by coating liquid or paste thermosetting epoxy-based resin including filler such as alumina or the like on the heat spreader 80 by spin coating, for example. With the above steps, a plurality of the wiring substrates 1 (see FIG. 1A and FIG. 1B) are formed.

Although the divided structure (wiring portion Z) is bonded to the heat spreader 80 via the adhesion layer 70 in the above described method, this is not limited so. For example, the adhesion layer 70 may be formed on the structure (wiring portion Z) in which the bus line is cut, and then, the structure (wiring portion Z) and the adhesion layer 70 may be divided. Next, the divided structure (wiring portion Z and the adhesion layer 70) may be stacked on the heat spreader 80 by applying pressure at predetermined temperature. Further, the wiring portion Z may be divided with the adhesion layer 70 and the heat spreader 80 after being bonded to the heat spreader 80 via the adhesion layer 70, for example. In such a process, side surfaces of the wiring portion Z, the adhesion layer 70 and the heat spreader 80 become flush with each other, for example. Here, in this embodiment, although the wiring portion Z, the adhesion layer 70 and the heat spreader 80 are formed to have the same plan shape (side surfaces thereof are flush with each other), this is not limited so. The wiring portion Z and the adhesion layer 70 may be formed to have a plan shape smaller than that of the heat spreader 80, for example.

Here, instead of the steps illustrated in FIG. 3A to FIG. 5B, steps illustrated in FIG. 6A to FIG. 6D may be used. First, in a step illustrated in FIG. 6A, similar to the step illustrated in FIG. 3A and FIG. 3B, the wirings 31 to 33 and the bus lines (not illustrated in the drawings) connected to the wirings 31 to 33 are formed by patterning the metal layer 30A.

Figure 6A:
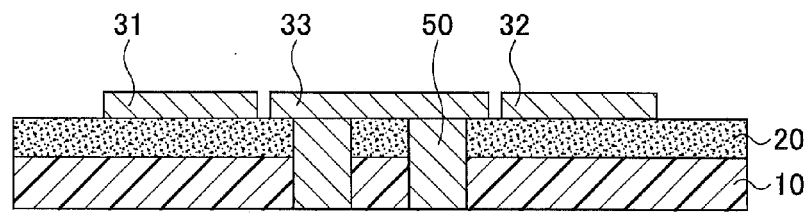
FIG. 6A to FIG. 6D are views illustrating an example of a manufacturing step of the wiring substrate of the first embodiment.
Figure 6B:
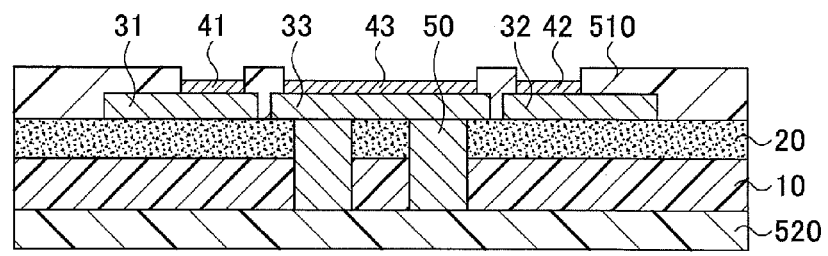
Figure 6C:
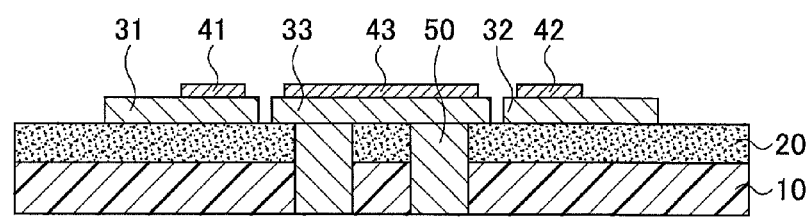

Next, in a step illustrated in FIG. 6B, the plating films 41 to 45 are formed on the wirings 31 to 33 by electroplating. Specifically, a resist film 510 that selectively exposes predetermined portions (portions where the plating films 41 to 45 are formed in FIG. 1A and FIG. 1B) of the upper surface of the wirings 31 to 33 is formed on the adhesion layer 20, for example. Further, a masking tape 520 is adhered to the other surface of the polyimide layer 10. Then, the plating films 41 to 45 are formed on the portions of the upper surface of the wirings 31 to 33 that are exposed from the resist film 510 by performing electroplating using an electric power supply path including the bus line connected to the wirings 31 to 33. The material, the thickness and the like of the plating films 41 to 45 are as explained above. Next, in a step illustrated in FIG. 6C the resist film 510 and the masking tape 520 are removed.

Figure 6D:
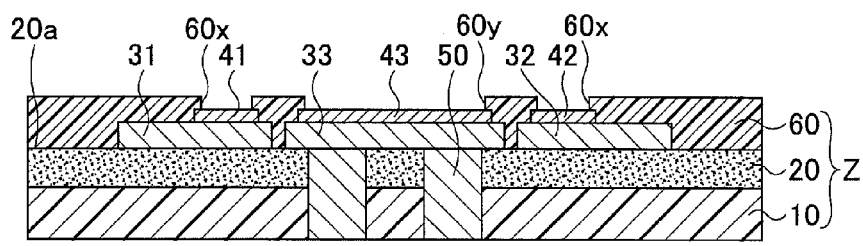

Next, in a step illustrated in FIG. 6D, similar to the step illustrated in FIG. 4A and FIG. 4B, the insulating layer 60 is formed on the predetermined portions (such as to expose the portions of the plating films 41 to 45 except their outer edge portions, for example) of the wirings 31 to 33. In FIG. 6D, an example is illustrated in which the insulating layer 60 is provided such that the outer edge portion 20a of the adhesion layer 20 is not exposed.

Finally, the outer edge portion of the structure illustrated in FIG. 6D is cut and divided by press working or the like. Then, the divided structure is adhered to the heat spreader 80 via the adhesion layer 70. With the above steps, a plurality of the wiring substrates 1 are formed.

Alternative Example 1 of the First Embodiment

In an alternative example 1 of the first embodiment, an example of a wiring substrate is explained in which areas where the through wirings are formed are different from those of the first embodiment. In the alternative example 1 of the first embodiment, the components same as those explained above are given the same reference numerals, and explanations are not repeated.

Figure 7A:
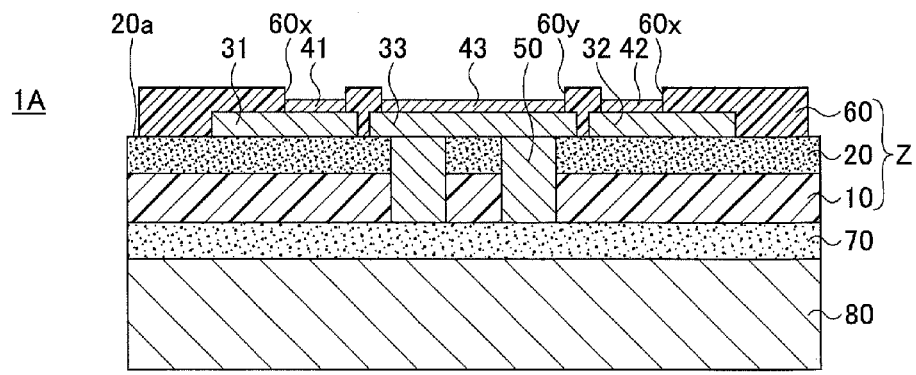
FIG. 7A and FIG. 7B are views illustrating an example of a wiring substrate of an alternative example 1 of the first embodiment.
Figure 7B:
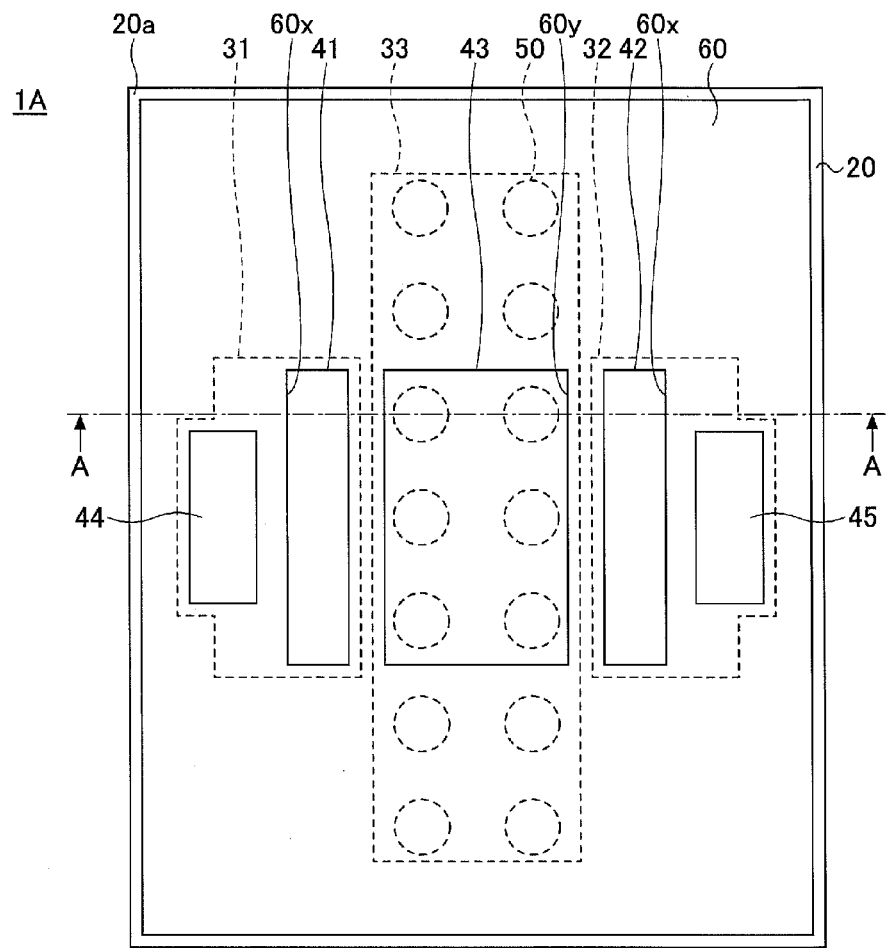

FIG. 7A and FIG. 7B are views illustrating an example of a wiring substrate 1A of the alternative example 1 of the first embodiment. FIG. 7B is a plan view and FIG. 7A is a cross-sectional view taken along an A-A line in FIG. 7B.

In the wiring substrate 1 of the first embodiment, the through wirings 50 are formed right below the wiring 33 that is exposed from the open portion 60y of the insulating layer 60 (where the plating film 43 is formed). However, different from the wiring substrate 1, in the wiring substrate 1A, the through wirings 50 are formed right below the area of the wiring 33 that is covered by the insulating layer 60, in addition to right below the wiring 33 that is exposed from the open portion 60y (where the plating film 43 is formed). In other words, the plurality of through wirings 50 are formed right below the entirety of the wiring 33. For example, the plurality of through wirings 50 may be provided as illustrated in FIG. 9B.

As such, by providing the plurality of through wirings 50 at the entirety of the wiring 33, thermal radiation efficiency can be further improved.

Although the explanation and drawings of the plurality of through wirings 50 may be omitted in some examples, the variation of the structure of the through wirings 50 may be adaptable to all of the examples.

Alternative Example 2 of First Embodiment

In an alternative example 2 of the first embodiment, an example of a wiring substrate is explained in which the plan shape of a wiring at which the through wirings are formed is different from the wiring 33 of the first embodiment. In the alternative example 2 of the first embodiment, the components same as those explained above are given the same reference numerals, and explanations are not repeated.

Figure 8A:
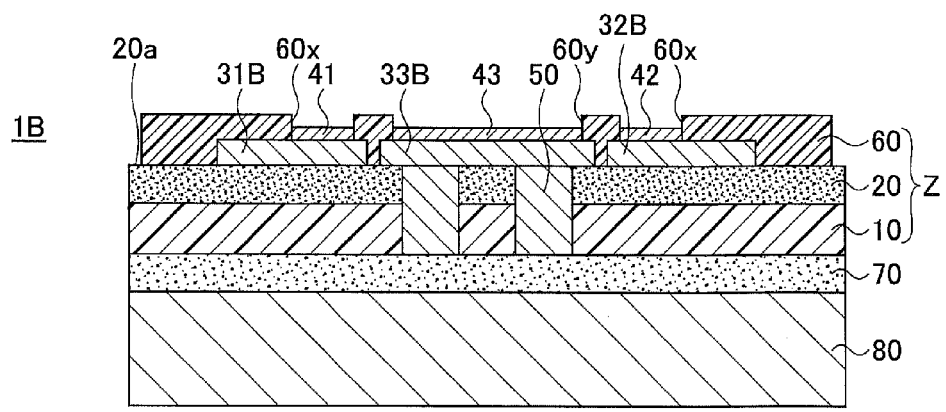
FIG. 8A and FIG. 8B are views illustrating an example of a wiring substrate of an alternative example 2 of the first embodiment.
Figure 8B:
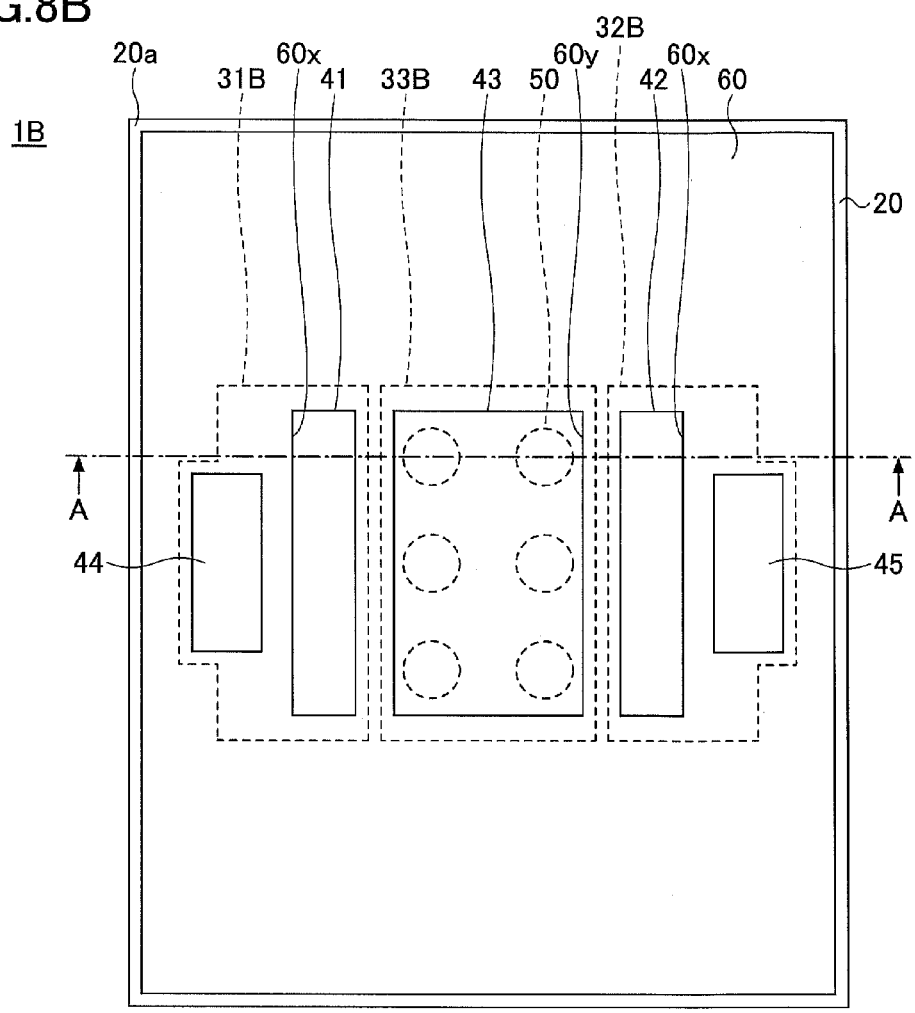

FIG. 8A and FIG. 8B are views explaining an example of a wiring substrate 1B of the alternative example 2 of the first embodiment. FIG. 8B is a plan view and FIG. 8A is a cross-sectional view taken along an A-A line in FIG. 8B.

With reference to FIG. 8A and FIG. 8B, the wiring substrate 1B is different from the wiring substrate 1 (see FIG. 1A and FIG. 1B) in that the wirings 31 to 33 are substituted by wirings 31B to 33B. The wirings 31B to 33B are formed on the adhesion layer 20 to be smaller than the wirings 31 to 33, respectively. In other words, the wirings 31B to 33B are only provided in the vicinity of areas where the plating films 41 to 43 are formed (area where the semiconductor device or the like is mounted).

As such, the wirings 31B to 33B may be only provided in the vicinity of the areas where the plating films 41 to 43 are formed (area where the semiconductor device or the like is mounted). By making the plan shape of the wiring 33B, that is the thermal diffusion wiring, smaller, the thermal radiation property is lowered. However, the size of the thermal diffusion wiring may be appropriately determined based on a required thermal radiation property.

Second Embodiment

In the second embodiment, an example of a semiconductor package is explained in which a semiconductor device (light emitting device) is mounted on the wiring substrate 1 of the first embodiment. In the second embodiment, the components same as those explained above are given the same reference numerals, and explanations are not repeated.

Figure 9A:
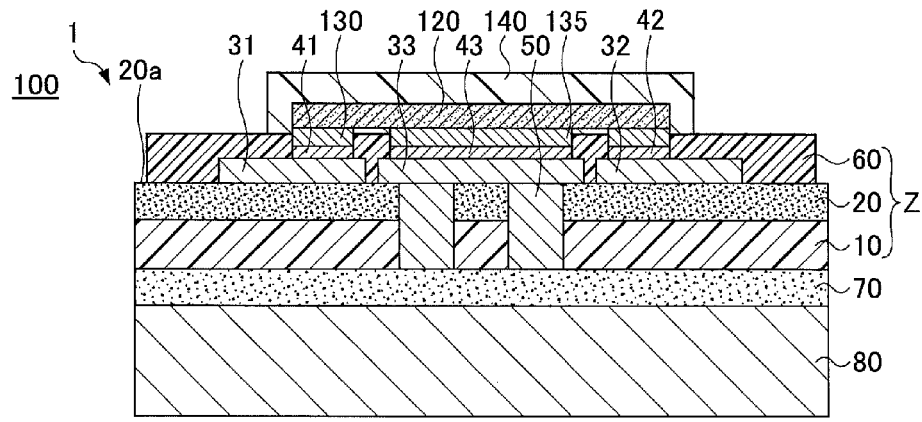
FIG. 9A and FIG. 9B are views illustrating an example of a semiconductor package of a second embodiment.
Figure 9B:
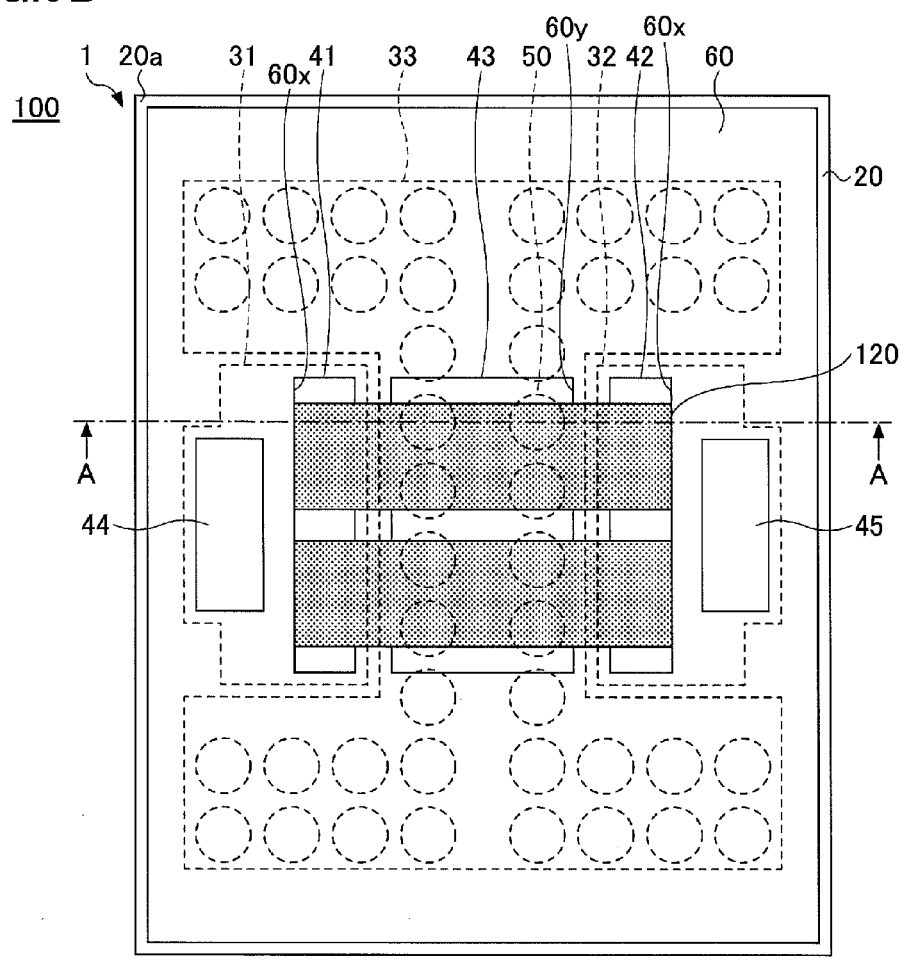

FIG. 9A and FIG. 9B are views illustrating an example of a semiconductor package 100 of the second embodiment. FIG. 9B is a plan view and FIG. 9A is a cross-sectional view taken along an A-A line in FIG. 9B. Here, in order to facilitate understanding of a positional relationship of semiconductor devices 120 and the through wirings 50, the semiconductor devices 120 are expressed by grey patterns and components formed on the wiring substrate 1 other than the semiconductor devices 120 are not illustrated in FIG. 9B.

With reference to FIG. 9A and FIG. 9B, the semiconductor package 100 includes the wiring substrate 1 (see FIG. 1A and FIG. 1B), the semiconductor devices 120, solder (not illustrated in the drawings) and sealing resin 140. The semiconductor devices 120 are mounted on the plating films 41 and 42 above the wirings 31 and 32 (electrical connection wirings) at the open portions 60x exposed from the insulating layer 60 and on the plating film 43 above the wiring 33 (diffusion wiring) at the open portion 60y exposed from the insulating layer 60, of the wiring substrate 1. Specifically, each of the semiconductor devices 120 includes electrical connection terminals 130 and a thermal diffusion terminal 135. The semiconductor devices 120 are flip-chip mounted on the wirings 31 and 32 (plating films 41 and 42) that are the electrical connection wirings, and the wiring 33 (plating film 43) that is the thermal diffusion wiring on the wiring substrate 1 via the solder (not illustrated in the drawings) in a face-down manner. Then, the semiconductor device 120 is sealed by the sealing resin 140. For the sealing resin 140, resin in which a fluorescent material is included in insulating resin such as epoxy-based resin, silicone-based resin or the like may be used, for example. Although an example in which the two semiconductor devices 120 are mounted on the wiring substrate 1 in parallel is illustrated in FIG. 9A and FIG. 9B, the number of the semiconductor devices 120 mounted on the wiring substrate 1 may be arbitrarily determined.

An anode terminal and a cathode terminal are provided at lower surfaces (surfaces facing the wiring substrate 1) of the electrical connection terminals 130 of each of the semiconductor devices 120, for example. For the semiconductor device 120, a light emitting device such as a Light Emitting Diode (LED) may be used. However, the light emitting device is not limited to the LED and a surface-emitting laser or the like may be used, for example. Here, an example in which the semiconductor device 120 is the LED is explained in the following.

One of the electrical connection terminals 130 of the semiconductor device 120 is connected to the plating film 41 of the wiring substrate 1 via the solder (not illustrated in the drawings), for example. Further, the other of the electrical connection terminals 130 of the semiconductor device 120 is connected to the plating film 42 of the wiring substrate 1 via the solder (not illustrated in the drawings), for example. Further, the thermal diffusion terminal 135 is provided in the vicinity of a center portion of the lower surface of the semiconductor device 120. The thermal diffusion terminal 135 is connected to the plating film 43 of the wiring substrate 1 via the solder (not illustrated in the drawings).

As described above in the first embodiment, in the wiring substrate 1, the wiring 33 that is the thermal diffusion wiring is formed to have a larger area than that of the thermal diffusion terminal 135 of the semiconductor device 120. Thus, the heat generated by the semiconductor device 120 can be efficiently diffused in a surface direction of the wiring 33.

For example, by connecting the plating films 44 and 45 of the wiring substrate 1 to a power source, a drive circuit or the like provided outside of the semiconductor package 100, and supplying a predetermined potential difference between the electrical connection terminals 130 of the semiconductor device 120, the semiconductor device 120 emits light. The semiconductor device 120 generates heat when emitting light. The heat generated by the semiconductor device 120 is transferred to the through wirings 50 via the plating film 43 and the wiring 33. Then, the heat is further transferred to the heat spreader 80 via the adhesion layer 70 so that the heat is radiated by the heat spreader 80. As the plurality of through wirings 50 are provided at the lower side of the thermal diffusion terminal 135 of the semiconductor device 120, the heat generated by the semiconductor device 120 can be efficiently transferred to the heat spreader 80.

Alternative Example 1 of Second Embodiment

In an alternative example 1 of the second embodiment, another example of a semiconductor package in which a semiconductor device (light emitting device) is mounted on the wiring substrate 1 of the first embodiment is explained. In the alternative example 1 of the second embodiment, the components same as those explained above are given the same reference numerals, and explanations are not repeated.

Figure 10A:
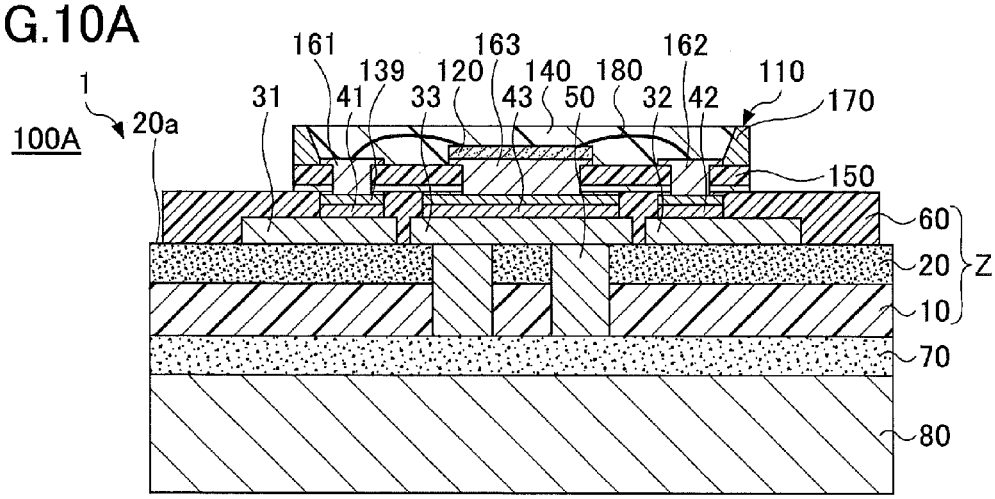
FIG. 10A and FIG. 10B are views illustrating an example of an alternative example 1 of the second embodiment.
Figure 10B:
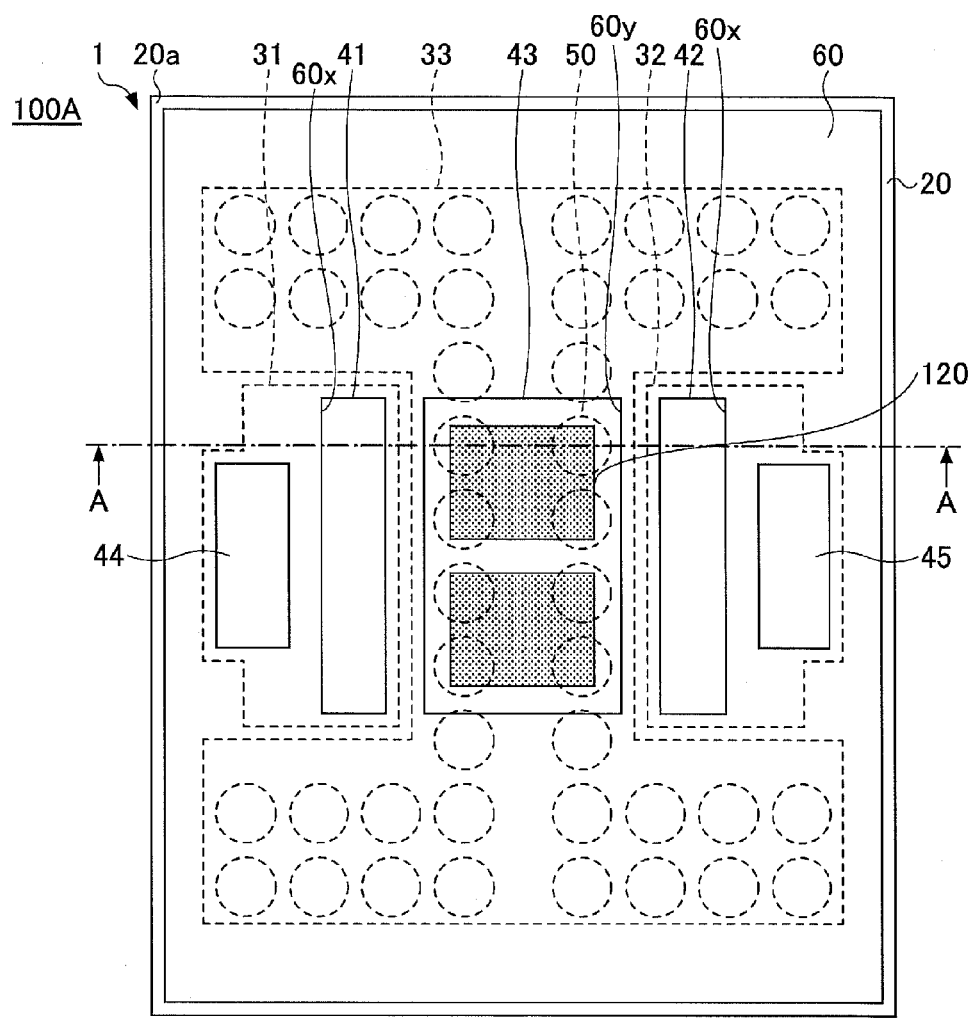

FIG. 10A and FIG. 10B are views illustrating an example of a semiconductor package 100A of the alternative example 1 of the second embodiment. FIG. 10B is a plan view and FIG. 10A is a cross-sectional view taken along an A-A line in FIG. 10B. Here, in order to facilitate understanding of a positional relationship of the semiconductor devices 120 and the through wirings 50, the semiconductor devices 120 are expressed by grey patterns and components formed on the wiring substrate 1 other than the semiconductor device 120 are not illustrated in FIG. 10B.

With reference to FIG. 10A and FIG. 10B, the semiconductor package 100A includes the wiring substrate 1 (see FIG. 1A and FIG. 1B) and semiconductor modules 110. For the example illustrated in FIG. 10A and FIG. 10B, two of the semiconductor modules 110 are mounted on the plating films 41 and 42 above the wirings 31 and 32 (electrical connection wirings) at the open portions 60x exposed from the insulating layer 60 and on the plating film 43 above the wiring 33 (diffusion wiring) at the open portion 60y exposed from the insulating layer 60, of the wiring substrate 1. Although an example in which the two semiconductor modules 110 are mounted on the wiring substrate 1 in parallel is illustrated in FIG. 10A and FIG. 10B, the number of the semiconductor modules 110 mounted on the wiring substrate 1 may be arbitrarily determined.

In each of the semiconductor modules 110, wirings 161 to 163 are formed in the substrate 150. The wirings 161 and 162 are electrical connection terminals that are electrically connected to the semiconductor device 120. Further, the wiring 163 is not electrically connected to the semiconductor device 120. The wiring 163 is a thermal radiation terminal that functions as a semiconductor device mounting portion and has a thermal radiation function. The semiconductor device 120 (LED) is mounted on the upper surface of the wiring 163 in a face-up manner. Further, the wirings 161 and 162 are electrically connected to the anode terminal and the cathode terminal (not illustrated in the drawings) of the semiconductor device 120 via bonding wires 180 at upper surfaces, respectively. A reflector 170 that reflects light emitted by the semiconductor device 120 is mounted at an outer edge portion of an upper surface of the substrate 150. Further, sealing resin 140 that seals the semiconductor device 120 is provided inside the reflector 170.

Lower surfaces of the wirings 161 and 162 are exposed from a lower surface of the substrate 150 and are connected to the wirings 31 and 32 (plating films 41 and 42), which are the electrical connection wirings, of the wiring substrate 1 via solder 139, respectively. A lower surface of the wiring 163 is exposed from the lower surface of the substrate 150 and is connected to the wiring 33 (plating film 43), which is the thermal diffusion wiring, of the wiring substrate 1 via the solder 139. In the wiring substrate 1, the wiring 33 is formed to have a larger area than that of the thermal radiation terminal (wiring 163) of the semiconductor module 110, as explained in the first embodiment. Thus, heat generated by the semiconductor device 120 can be effectively radiated.

For example, by connecting the plating films 44 and 45 of the wiring substrate 1 to a power source, a drive circuit or the like provided outside of the semiconductor package 100A, and supplying a predetermined potential difference between the cathode terminal and the anode terminal of the semiconductor device 120, the semiconductor device 120 emits light. The semiconductor device 120 generates heat when emitting light. The heat generated by the semiconductor device 120 is transferred to the through wirings 50 via the wiring 163 (thermal radiation terminal), the plating film 43 and the wiring 33. Then, the heat is further transferred to the heat spreader 80 via the adhesion layer 70 so that the heat is radiated by the heat spreader 80. As the plurality of through wirings 50 are provided at the lower side of the thermal radiation terminal of the semiconductor module 110, the heat generated by the semiconductor device 120 can be efficiently transferred to the heat spreader 80.

Alternative Example 2 of Second Embodiment

In an alternative example 2 of the second embodiment, another example of the semiconductor package in which the semiconductor device (light emitting device) is mounted on the wiring substrate 1 of the first embodiment is explained. In the alternative example 2 of the second embodiment, the components same as those explained above are given the same reference numerals, and explanations are not repeated.

Figure 11A:
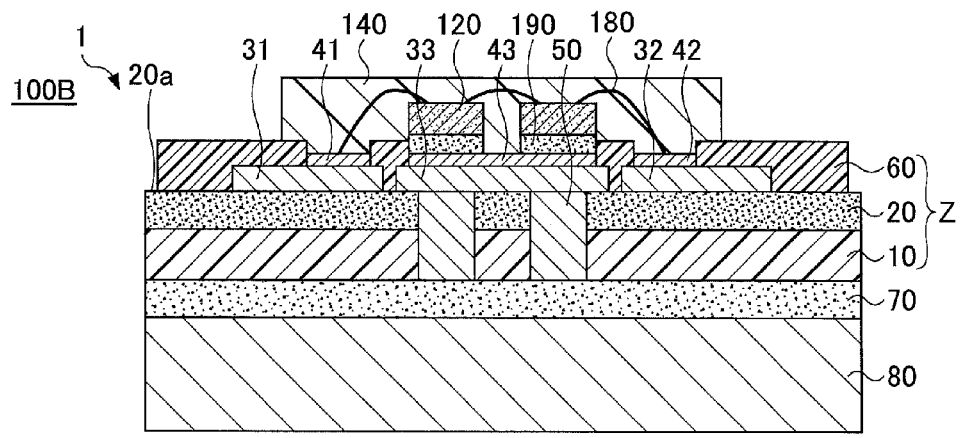
FIG. 11A and FIG. 11B are views illustrating an example of a semiconductor package of an alternative example 2 of the second embodiment.
Figure 11B:
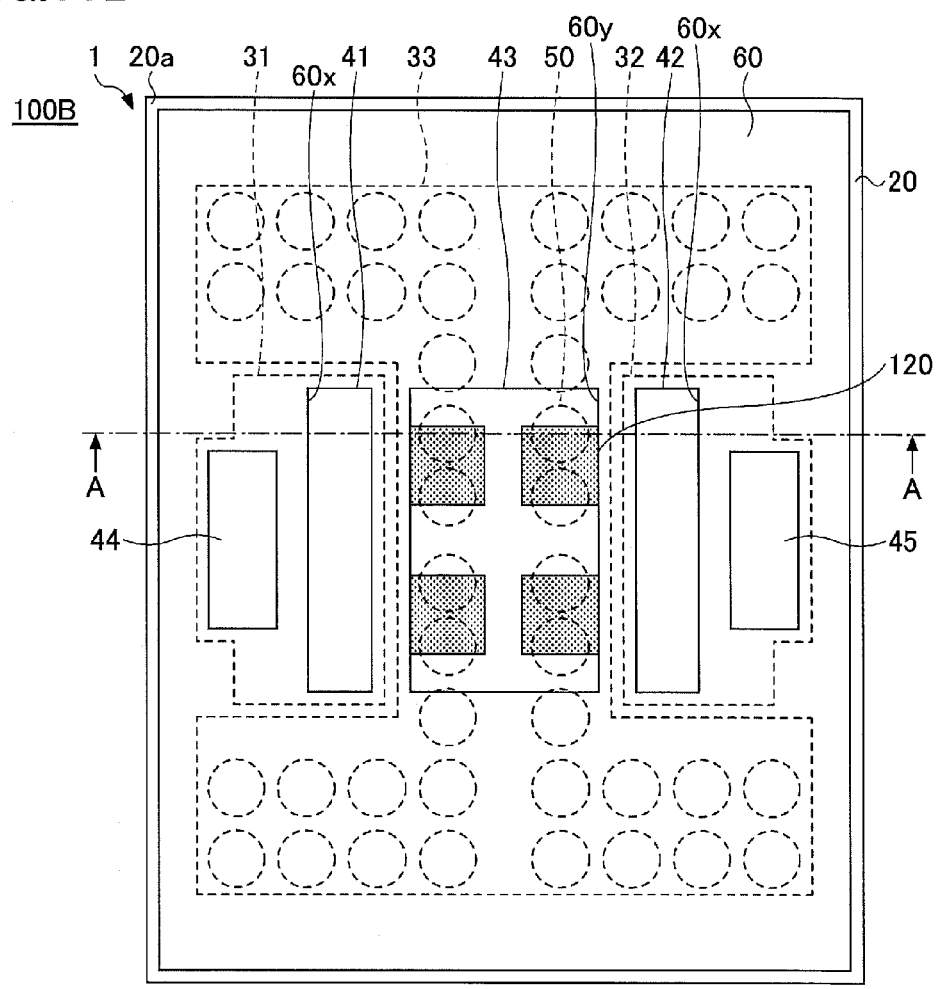

FIG. 11A and FIG. 11B are views illustrating an example of a semiconductor package 100B of the alternative example 2 of the second embodiment. FIG. 11B is a plan view and FIG. 11A is a cross-sectional view taken along an A-A line in FIG. 11B. Here, in order to facilitate understanding of a positional relationship of the semiconductor devices 120 and the through wirings 50, the semiconductor devices 120 are expressed by grey patterns and components formed on the wiring substrate 1 other than the semiconductor device 120 are not illustrated in FIG. 11B.

With reference to FIG. 11A and FIG. 11B, in the semiconductor package 100B, the semiconductor devices 120 are mounted on the plating film 43 above the wiring 33 at the open portion 60y of the insulating layer 60 exposed from the insulating layer 60, of the wiring substrate 1. Specifically, each of a plurality of the semiconductor devices 120 is mounted on the plating film 43 of the wiring substrate 1 via an adhesion layer 190 such as a die attach film or the like in a face-up manner. Each of the semiconductor devices 120 is sealed by the sealing resin 140. Although an example in which the four semiconductor devices 120 are mounted on the wiring substrate 1 is illustrated in FIG. 11A and FIG. 11B, the number of the semiconductor devices 120 mounted on the wiring substrate 1 may be arbitrarily determined.

Two of the semiconductor devices 120 aligned in a shorter direction (in a direction in which the plating films 41 to 45 are aligned) are connected in series via the bonding wire 180. For example, the anode terminal of one of the semiconductor devices 120 aligned in the shorter direction of the plating film 43 and the cathode terminal of the other of the semiconductor devices 120 aligned in the shorter direction of the plating film 43 are connected via the bonding wire 180. Then, for example, the cathode terminal of the one of the semiconductor devices 120 is connected to the plating film 41 via another bonding wire 180, and the anode terminal of the other of the semiconductor devices 120 is connected to the plating film 42 via another bonding wire 180. Further, two combinations of the two semiconductor devices 120 aligned in the shorter direction of the plating film 43 and electrically connected in series are aligned in a longer direction of the plating film 43 and electrically connected in parallel.

In the wiring substrate 1, the wiring 33 (thermal diffusion wiring) is formed to have a larger area than a plan shape of the semiconductor device 120, which is to be mounted on the wiring substrate 1. Thus, the heat generated by the semiconductor device 120 can be efficiently radiated.

For example, by connecting the plating films 44 and 45 of the wiring substrate 1 to a power source, a drive circuit or the like provided outside of the semiconductor package 100B, and supplying a predetermined potential difference between the cathode terminal and the anode terminal of each of the semiconductor devices 120, the semiconductor device 120 emits light. The semiconductor device 120 generates heat when emitting light. The heat generated by the semiconductor devices 120 is transferred to the through wirings 50 via the plating film 43 and the wiring 33. Then, the heat is further transferred to the heat spreader 80 via the adhesion layer 70 so that the heat is radiated by the heat spreader 80. As the plurality of through wirings 50 are provided at the lower side of the wiring 33 on which the semiconductor devices 120 are mounted, the heat generated by the semiconductor devices 120 can be efficiently transferred to the heat spreader 80.

Although the semiconductor package is explained with reference to FIG. 9A to FIG. 11B, preferable positional relationships between an outer shape of the semiconductor device 120 and the through wirings 50 in the semiconductor package are explained with reference to FIG. 12A to FIG. 12D.

FIG. 12A to FIG. 12D are views for explaining a positional relationship between an outer shape of the semiconductor device 120 and the through wirings 50. As illustrated in FIG. 12A to FIG. 12D, it is preferable that at least a part of the through wiring 50 is placed within a range of an outer shape of the semiconductor device 120 in a plan view. Further, it is preferable that two or more of the through wirings 50 are placed within the range of the outer shape of the semiconductor device 120 in a plan view.

Figure 12A:
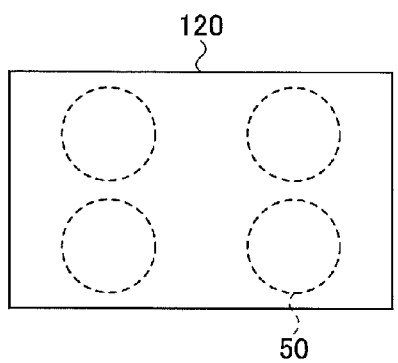
FIG. 12A to FIG. 12D are views for explaining a positional relationship between an outer shape of a semiconductor device and through wirings.

For example, as illustrated in FIG. 12A, all of the four through wirings 50 may be placed within the range of the outer shape of the semiconductor device 120 in a plan view. The number of the through wirings 50 placed within the range of the outer shape of the semiconductor device 120 may be one, two, three or more than four. As described above, it is preferable that the number of the through wirings 50 placed within the range of the outer shape of the semiconductor device 120 is two or more.

Figure 12B:
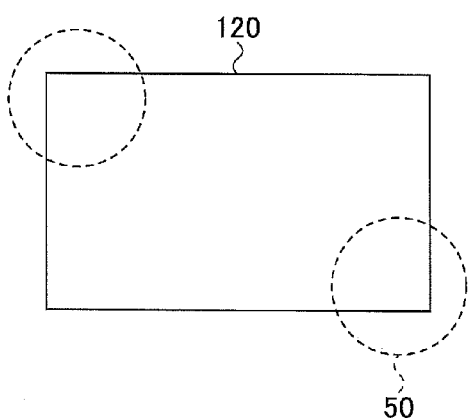
Figure 12C:
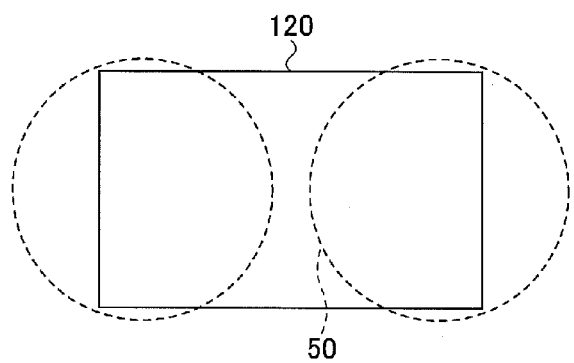

Further, as illustrated in FIG. 12B and FIG. 12C, a part of each of the through wirings 50 may not be placed within the range of the outer shape of the semiconductor device 120 provided that at least parts of two of the through wirings 50 are placed within the range of the outer shape of the semiconductor device 120, in a plan view. Further, the through wirings 50 may be placed in various arrangements such as two of them are at a diagonal with each other with respect to a side of the outer shape of the semiconductor device 120, or two of them are placed to face with each other with respect to a side of the outer shape of the semiconductor device 120.

Figure 12D:
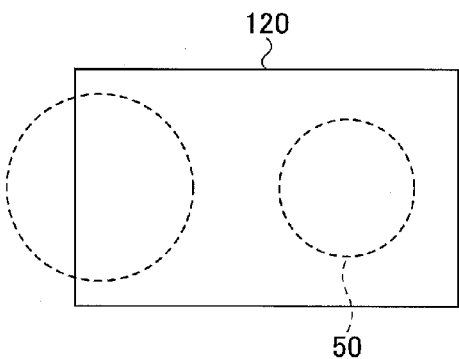

Further, as illustrated in FIG. 12D, the entirety of one of the through wirings 50 may be within the range of the outer shape of the semiconductor device 120 and a part of the other of the through wirings 50 may be within the range of the outer shape of the semiconductor device 120 provided that at least two through wirings 50 are placed to overlap the range of the outer shape of the semiconductor device 120, in a plan view. Further, the through wirings 50 having different plan shapes may be placed to overlap the range of the outer shape of the semiconductor device 120.

As illustrated in FIG. 12A to FIG. 12D, the thermal radiation property can be further improved by providing the plurality of through wirings 50 such that at least a part of each of the through wirings 50 overlap the region within the outer shape of the semiconductor device 120 in a plan view.

In other words, for example, if only a single through wiring 50 is placed within the range of the outer shape of the semiconductor device 120 in a plan view, heat tends to be concentrated on the single through wiring 50. Thus, thermal radiation effects may decrease. However, by providing the plurality (two or more) of through wirings 50 such that at least a part of each of them overlaps the region within the outer shape of the semiconductor device 120, concentration of heat can be prevented and the thermal radiation property can be improved.

Third Embodiment

In the third embodiment, an example is illustrated in which the wiring substrate includes the through wiring that are protruded from the polyimide layer. In the third embodiment, the components same as those explained above are given the same reference numerals, and explanations are not repeated.

Figure 13:
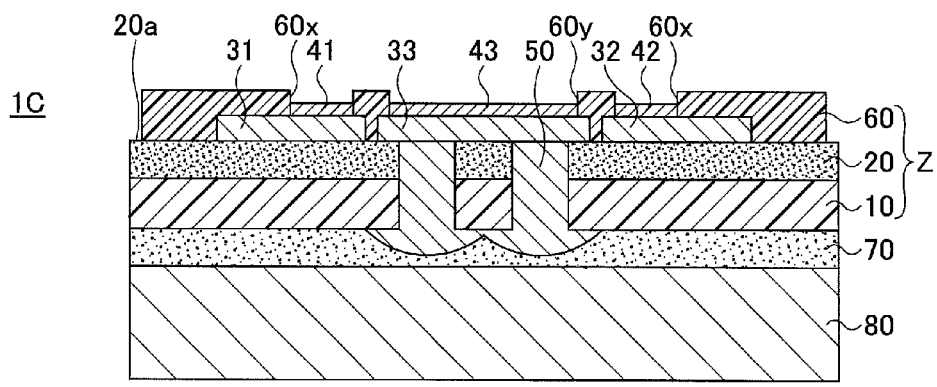
FIG. 13 is a cross-sectional view illustrating an example of a wiring substrate of a third embodiment.

FIG. 13 is a cross-sectional view illustrating an example of a wiring substrate 1C of the third embodiment. The other ends of the through wirings 50 may have protruding portions that are protruded from the other surface of the polyimide layer 10, respectively, as described above. In such a case, as the wiring substrate 1C illustrated in FIG. 13, the protruding portions of the adjacent through wirings 50 may contact with each other. Further, in the wiring substrate 1C, the diameters of the through wirings 50 may be the same or may be different. Further, in the wiring substrate 1C, the diameters or the protruding amounts of the protruding portions of the through wirings 50 may be the same or may be different.

By forming the through wirings 50 such that the other ends of the through wirings 50 are protruded from the other surface of the polyimide layer 10 to the extent that the protruding portions of the adjacent through wirings 50 contact with each other, surface areas of the other ends of the through wirings are greatly increased. Thus, the thermal radiation property can further be improved.

Figure 14:
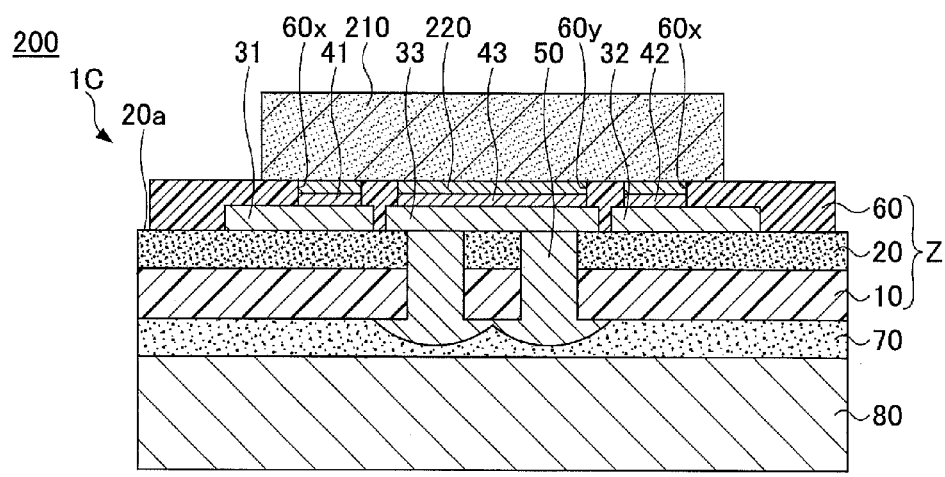
FIG. 14 is a cross-sectional view illustrating an example of a semiconductor package of the third embodiment.

FIG. 14 is a cross-sectional view illustrating an example of a semiconductor package 200 of the third embodiment. In the semiconductor package 200 illustrated in FIG. 14, a heat generation semiconductor device 210, other than the light emitting device, is flip-chip mounted on the wiring substrate 1C via solder 220 in a face-down manner.

Specifically, electrical connection terminals (not illustrated in the drawings) of the semiconductor device 210 are connected to the wirings 31 and 32 (plating films 41 and 42), which are the electrical connection wirings, via the solder 220 on the wiring substrate 1C. Further, a thermal diffusion terminal (not illustrated in the drawings) of the semiconductor device 210 is connected to the wiring 33 (plating film 43), which is the thermal diffusion wiring, via the solder 220 on the wiring substrate 1C. The number of the semiconductor devices 210 to be mounted on the wiring substrate 1C may be arbitrarily determined.

For the semiconductor device 210, a known heat generation semiconductor device that generates heat when being operated may be used. As an example of the semiconductor device 210, a power semiconductor device or the like such as an Insulated Gate Bipolar Transistor (IGBT), a Metal-Oxide-Semiconductor Field-Effect Transistor (MOSFET) or the like may be used.

As such, the semiconductor device to be mounted on the wiring substrate 1C is not limited to the light emitting device and a known heat generation semiconductor device that generates heat by current that flows when being operated may be mounted. As the wiring substrate 1C has a good thermal radiation property, a thermal radiation property of the heat generation semiconductor device that is mounted on the wiring substrate 1C can be improved and a problem caused by heat can be reduced. Similarly, the heat generation semiconductor device may be mounted on the wiring substrate 1, 1A or 1B.

As described above, when the semiconductor device is the light emitting device, it is preferable that a reflection film made of white ink or the like is used as the insulating layer 60 in order to increase reflectivity of the light emitted by the light emitting device and to increase thermal diffusivity. However, when the heat generation semiconductor device other than the light emitting device is mounted, it is unnecessary to use the reflection film as the insulating layer 60, and the insulating layer 60 may be formed to have a function different from the reflection film. For example, a solder resist layer may be used as the insulating layer 60. Further, various insulating layers made of epoxy-based resin, polyimide-based resin or the like may be used as the insulating layer 60. Further, the insulating layer 60 may not be formed, in accordance with necessity.

According to the embodiment, a wiring substrate or the like capable of ensuring an insulation property and improving a thermal radiation property at the same time can be provided.

Although a preferred embodiment of the wiring substrate or the like has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, as illustrated in FIG. 11A and FIG. 11B, when the semiconductor device 120 is mounted in a face-up manner, and the back surface of the semiconductor device 120 and the plating film 43 are connected via the adhesion layer 190 without being connected by solder or the like, the entirety of the wiring 33 may be covered by the insulating layer 60 without providing the plating film 43. In other words, the insulating layer 60 may not be provided with the open portion that exposes the wiring 33. In such a case, the semiconductor device 120 is mounted on the insulating layer 60 that covers the wiring 33 via the adhesion layer 190. In other words, the insulating layer 60 exists right below the semiconductor device 120.

Further, instead of adhering the metal layer 30A to the polyimide layer 10 via the adhesion layer 20, the following method may be used. That is, a method of repairing a polyimide layer 10 that is a polyimide-based resin film (polyimide tape) or the like, and forming a metal layer made of copper (Cu) or the like directly on the one surface of the polyimide layer 10 by electroless plating, sputtering, electroplating or the like (adhesion layer 20 is not provided) may be used. In such a case, the metal layer formed as such has the same function as the metal layer 30A and functions as the metal layer 30A. In such a case, the through holes 10x are only formed in the polyimide layer 10 by laser processing or the like. In other words, one ends of the through holes 10x are covered by the metal layer formed on the polyimide layer 10. In this case, the adhesion layer 20 is not provided.

Further, as another example, the polyimide layer 10 may be formed by coating polyimide-based insulating resin on a metal film such as a copper film or the like. In such a case as well, the through holes 10x are only formed in the polyimide layer 10 by laser processing or the like. In other words, one ends of the through holes 10x are covered by the metal film formed on the polyimide layer 10. In this case as well, the adhesion layer 20 is not provided.

What is claimed is:
1. A wiring substrate on which a semiconductor device is mounted, the wiring substrate comprising:
    a heat spreader;
    a polyimide layer provided on the heat spreader via an adhesion layer that includes filler, the polyimide layer being provided with a plurality of through holes penetrating the polyimide layer in the thickness direction;
    a plurality of through wirings formed to fill the through holes provided at the polyimide layer, respectively;

a thermal diffusion wiring provided on the polyimide layer so as to be connected to the through wirings, the thermal diffusion wiring being configured not to be electrically connected to the semiconductor device;

an electrical connection wiring provided on the polyimide layer at a same plane with the thermal diffusion wiring, the electrical connection wiring being configured to be electrically connected to the semiconductor device; and an insulating layer provided on the polyimide layer and provided with a first open portion that exposes the electrical connection wiring and a second open portion that exposes the thermal diffusion wiring, the thermal diffusion wiring being formed to extend at an outer side of the second open portion, in a plan view, and have a larger area than the electrical connection wiring, in a plan view.

2. The wiring substrate according to claim 1,
wherein the semiconductor device is a light emitting device, and
wherein the insulating layer is a reflection film that reflects light emitted from the light emitting device.

3. The wiring substrate according to claim 1,
wherein, in a plan view, at least one of the plurality of through wirings is placed such that at least a part of the one through wiring overlaps a range within an outer shape of the semiconductor device, which is to be mounted on the wiring substrate.

4. The wiring substrate according to claim 1,
wherein the electrical connection wiring is only formed on a plane surface, and
wherein the through wirings do not exist in the polyimide layer and in the adhesion layer at an area overlapping with the electrical connection wiring in a plan view.

5. The wiring substrate according to claim 1,
wherein each of the through wirings includes a protruding portion that is protruded from a surface of the polyimide layer, the surface facing the adhesion layer.

6. The wiring substrate according to claim 5,
wherein the protruding portions of the adjacent through wirings contact with each other.

7. The wiring substrate according to claim 1,
wherein, in a plan view, at least two of the plurality of through wirings are placed such that at least a part of each of the two through wirings overlaps a range within an outer shape of the semiconductor device, which is to be mounted on the wiring substrate.

8. A semiconductor package comprising:
the wiring substrate according to claim 1; and
the semiconductor device mounted on a surface of the thermal diffusion wiring that is exposed from the insulating layer.

9. The wiring substrate according to claim 1,
wherein the thermal diffusion wiring being formed to extend to be larger than the second open portion so that a part of the thermal diffusion wiring is covered with the insulating layer, in a plan view, and
the thermal diffusion wiring being formed to have a larger area than the electrical connection wiring, in a plan view.

10. The wiring substrate according to claim 1,
wherein the thermal diffusion wiring is formed to extend at an area that does not overlap the semiconductor device when the semiconductor device is mounted on the wiring substrate.

11. The wiring substrate according to claim 1,
wherein the thermal diffusion wiring is formed to cover the polyimide layer except an area where the electrical connection wiring is formed while being spaced from the electrical connection wiring.

* * * * *